United States Patent [19]

Piovano

[11] Patent Number: 5,711,641
[45] Date of Patent: Jan. 27, 1998

[54] METHOD AND DEVICE FOR LOADING AND UNLOADING PRINTED CIRCUIT BOARDS ON A MACHINE TOOL

[75] Inventor: Luigi Piovano, Giusto Canavese, Italy

[73] Assignee: Pluritec Italia S.p.A., Borgomanero, Italy

[21] Appl. No.: 560,236

[22] Filed: Nov. 21, 1995

[30] Foreign Application Priority Data

Jul. 14, 1995 [IT] Italy .................................. TO95A0597
Nov. 21, 1995 [IT] Italy .................................. TO94A0958

[51] Int. Cl.[6] .................................................. B23B 35/00
[52] U.S. Cl. ........................... 408/1 R; 408/69; 408/87; 408/234; 414/19
[58] Field of Search .................... 408/1 R, 69, 87, 408/234, 42, 53; 414/19, 20, 222, 331, 401, 901

[56] References Cited

U.S. PATENT DOCUMENTS

| | | | |
|---|---|---|---|
| 4,480,364 | 11/1984 | Kosmowski | 408/87 X |
| 4,786,216 | 11/1988 | Kitagawa et al. | 408/87 X |
| 4,824,310 | 4/1989 | Kosmowski et al. | 414/222 |
| 4,867,297 | 9/1989 | Saitoh et al. | 408/69 X |
| 5,263,800 | 11/1993 | Chen | 408/234 X |
| 5,354,153 | 10/1994 | Ottone et al. | 408/69 X |

Primary Examiner—Daniel W. Howell
Assistant Examiner—Henry W.H. Tsai
Attorney, Agent, or Firm—Kenyon & Kenyon

[57] ABSTRACT

The device presents a number of supports associated with a number of machining heads and located at the front of the machine. For each machining head, the supports are located on two superimposed surfaces for respectively supporting a pack of boards for loading and a pack of boards unloaded off the work table. The supports are fitted to a frame which is moved vertically to position the two surfaces at the table, and which is also movable laterally for enabling access to the machine. The device also presents a cross member movable along the Y axis; and a number of arms for alternately engaging two opposite edges of the packs and transferring them between the table and the supports. The arms are connected to a common connecting rod which is moved to rotate and withdraw them clear of the packs during the idle movement of the cross member.

23 Claims, 9 Drawing Sheets

METHOD AND DEVICE FOR LOADING AND UNLOADING PRINTED CIRCUIT BOARDS ON A MACHINE TOOL

BACKGROUND OF THE INVENTION

The present invention relates to a method and device for loading and unloading printed circuit boards on a machine tool.

Machine tools for machining printed circuits normally comprise a table for supporting at least one group of circuit boards connected together for simultaneous machining, and which are fixed between two protection plates to form an assembly hereinafter referred to as a "pack".

Various devices are known for automatically feeding the packs on to the work table. In one known solution, the packs for machining are placed inside a loading rack featuring a first device for transferring them to the table; and an unloading rack receives the machined packs and presents a second device for retrieving them from the table. In addition to being bulky, the above solution is also difficult and expensive to produce.

Another known solution, designed for machines with a single machining head, presents a single rack located to the rear of the machine; and the packs are removed from a given cell on the rack and replaced inside the same cell using the movement of the table in conjunction with retractable stops. Besides taking a relatively long time to transfer the packs, the above solution is unsuitable for machine tools with a number of machining heads.

Yet another known solution presents two superimposed surfaces, one each for supporting the pack for machining and the machined pack; the two surfaces are movable vertically and positioned alternately at the table; and the packs are transferred by grippers operated by chain means. In this case, operation of the device is extremely complicated and unreliable.

SUMMARY OF THE INVENTION

It is an object of the present invention to provide a method and device for loading and unloading printed circuit boards, and which provide for overcoming the aforementioned drawbacks typically associated with known devices.

According to the present invention, there is provided a device for loading and unloading printed circuit boards on a machine tool comprising a table for supporting at least one pack comprising a group of mutually connected circuit boards, at least one machining head, and means for controlling relative displacement of said head and said table along two axes; said device comprising two superimposed surfaces for respectively supporting a first pack unloaded off the table and a second pack for loading on to the table, said surfaces being movable vertically and positioned alternately at the table; and means for transferring the packs between the table and said surfaces; characterized in that said transfer means alternately engage two opposite edges of each said pack, so as to transfer the packs by pushing them.

The above device implements a printed circuit board loading and unloading method characterized in that it comprises the following steps: when machining a first pack, a first surface of a tray is positioned at the table, and a second pack is loaded on to a second surface of the tray; at the end of said machining operation, the first pack is transferred from the table on to said first surface, the tray is moved to position said second surface at the table, the second pack is transferred from the second surface on to the table, and the first pack is unloaded off the first surface.

BRIEF DESCRIPTION OF THE DRAWINGS

TWO preferred, non-limiting embodiments of the present invention will be described by way of example with reference to the accompanying drawings, in which.

DETAILED DESCRIPTION OF THE INVENTION

Figure 1:
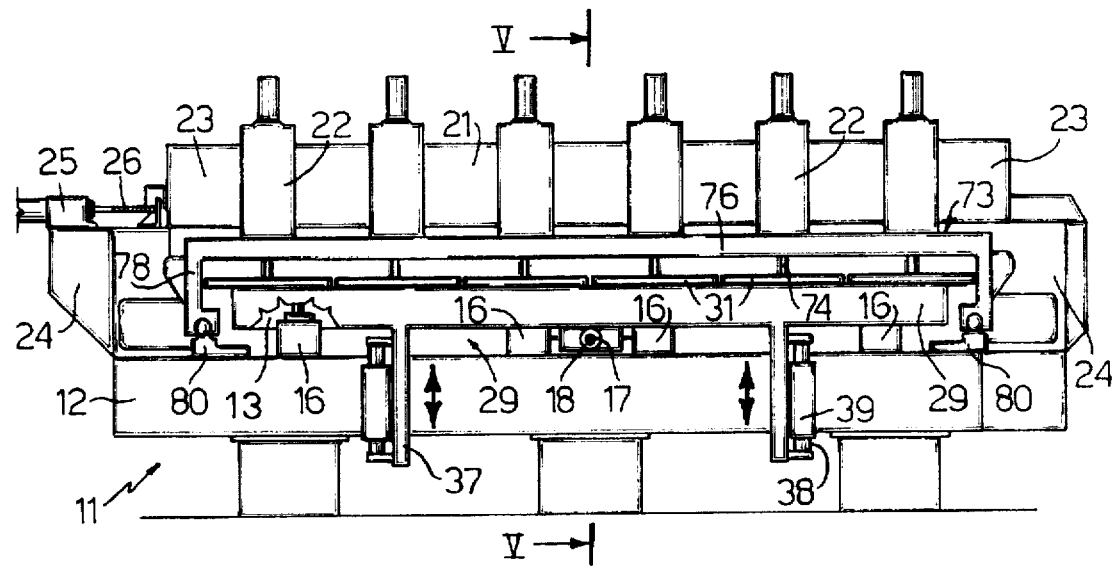
FIG. 1 shows a schematic front view of a machine for drilling printed circuit boards, and incorporating a first embodiment of a loading and unloading device in accordance with the present invention.
Figure 2:
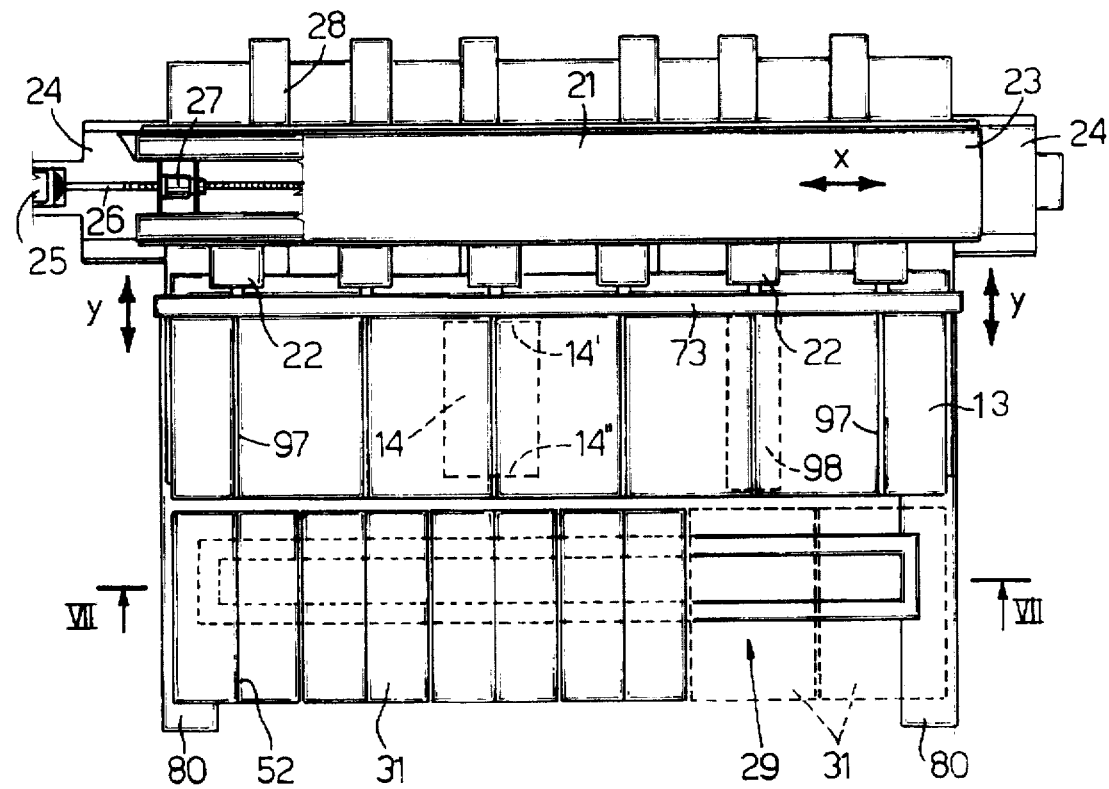
FIG. 2 shows a plan view of the FIG. 1 machine.
Figure 4:
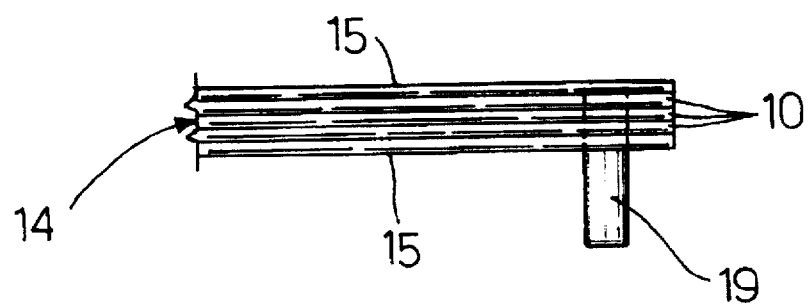
FIG. 4 shows a partial larger-scale view of a pack of printed circuit boards.

With reference to FIGS. 1 and 2, number 11 indicates the bed of a machine tool, in particular a drilling machine, for machining printed circuit boards. Bed 11 comprises a strong block 12 of granite on which slides a work table 13 for supporting a series of six packs 14 of printed circuit boards 10 (FIG. 4), only one of which is shown by the dotted line in FIG. 2, and each of which is rectangular and presents two opposite edges 14' and 14".

Block 12 (FIG. 1) is fitted with two pairs of prismatic bars 16 along which table 13 slides by means of aerostatic pads. For which purpose, a screw 17 on block 12 engages a nut screw 18 integral with table 13, and is rotated by a numerical-control servomotor (not shown) to move table 13 along an axis indicated as axis Y in FIG. 2.

Each pack 14 (FIG. 4) comprises a number of fiberglass-reinforced plastic boards 10 on which a conductive metal layer has been deposited according to the required circuit pattern, and which are packed together between two auxiliary plates 15 of the same size as boards 10. The bottom auxiliary plate 15 presents two pins 19 (only one shown in FIG. 4) projecting downwards, located along the center line of pack 14, close to edges 14' and 14", and which serve as a locator for aligning and positioning pack 14.

Figure 3:
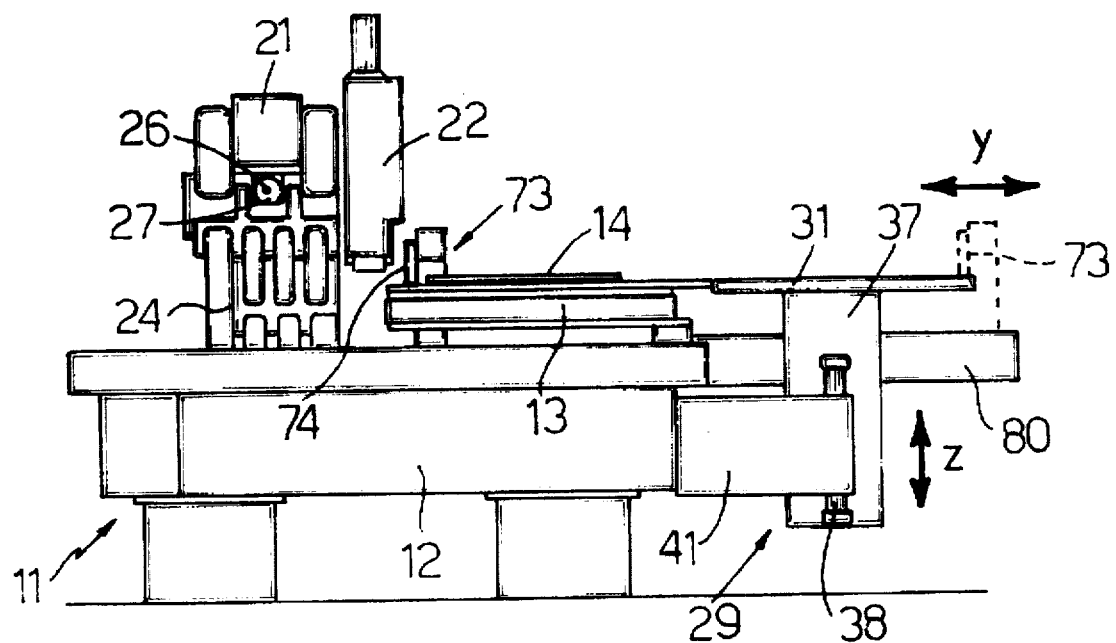
FIG. 3 shows a side view of the FIG. 1 machine.

The drilling machine also comprises a rectangular-section crosspiece 21 (FIGS. 1–3) presenting a series of six machining heads 22 for packs 14 on table 13. Crosspiece 21 presents two end portions 23 which are guided transversely on two uprights 24 of bed 11 to move crosspiece 21 along an axis indicated as axis X. For which purpose, one of uprights 24 presents a screw 26 which engages a nut screw 27 on crosspiece 21 and is rotated by a further numerical-control servomotor 25 to move crosspiece 21 along axis X.

For each machining head 22, the drilling machine also comprises a respective tool-change device comprising a tool store 28 in the form of a drum (FIG. 2), located at the rear of the machine, and which substantially operates as described in Italian Patent Application n. TO93A 000832 filed by the present Applicant.

According to the invention, at the front, the drilling machine presents a structure indicated as a whole by 29, and which is movable vertically and fitted with a number of trays 31 associated with machining heads 22. More specifically, structure 29 comprises a rectangular-section frame 32 (FIGS. 5, 6) comprising two transverse steel channel sections 33 connected by two lateral pairs of channel sections 34 and by a central channel section 35. Each transverse section 33 is fitted with a respective inverted-L-shaped section 36, 36', the upper leg of which serves as a support for the corresponding tray 31, as described in more detail later on.

Figure 5:
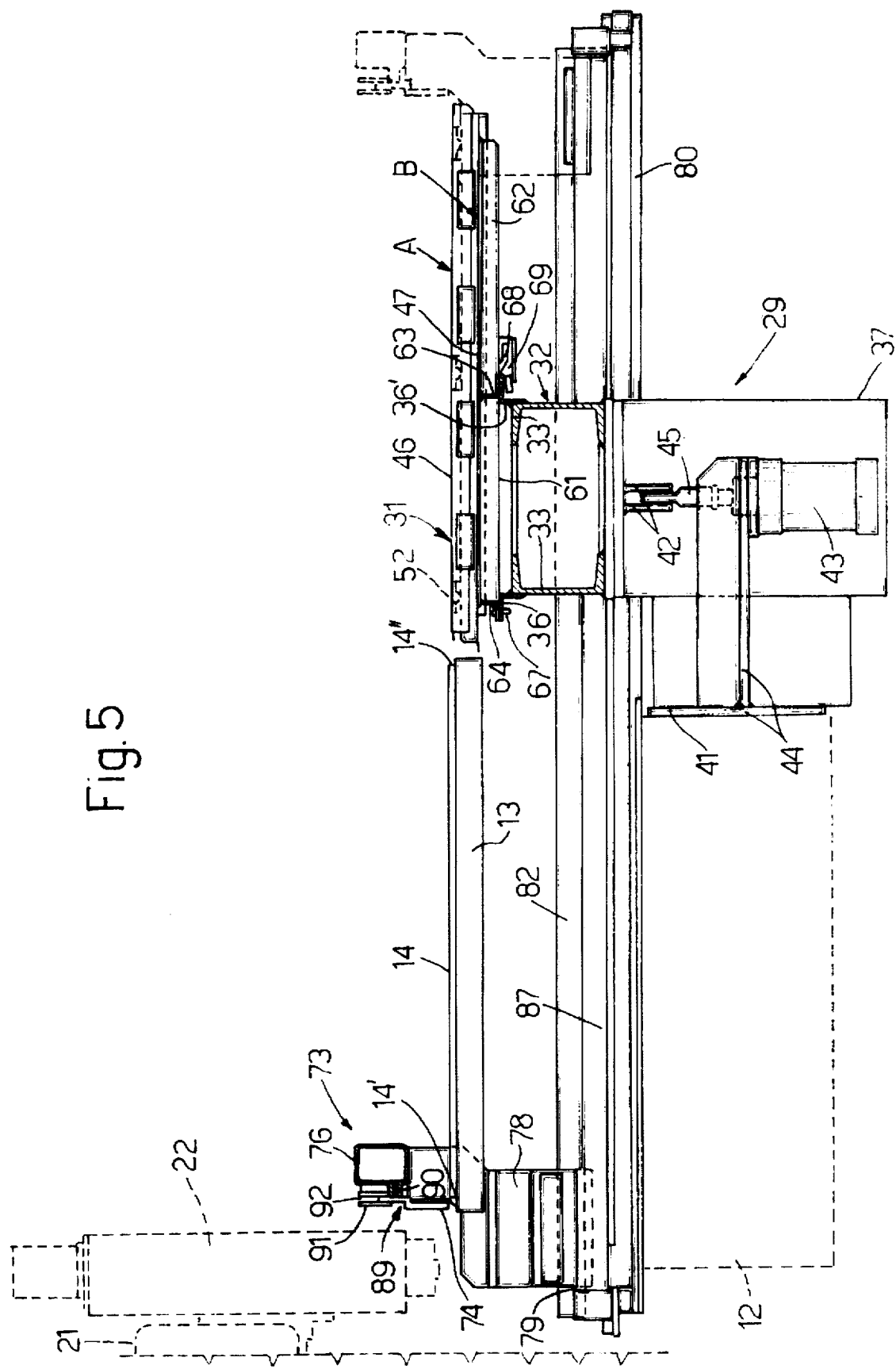
FIG. 5 shows a larger-scale section along line V—V in FIG. 1.
Figure 6:
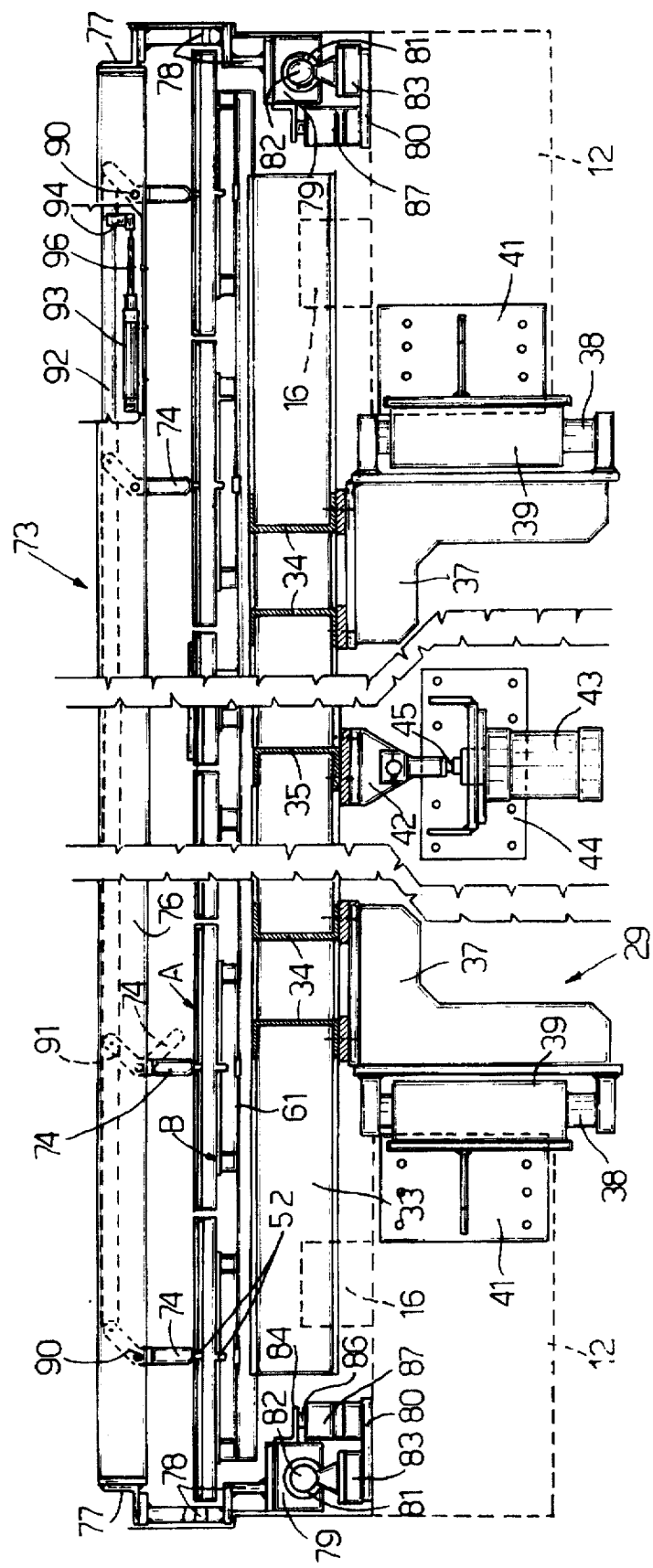
FIG. 6 shows a partial larger-scale section along line VI—VI in FIG. 2.

Each pair of lateral sections 34 is fitted to a bracket 37 (FIG. 6) supporting a vertical guide bar 38, which is guided by a known cylindrical ball guide 39 fitted by a support 41 to block 12 indicated by the dotted line in FIGS. 5 and 6. Central section 35 is connected by a pair of brackets 42 to a linear actuator comprising a pneumatic cylinder 43 fitted to block 12 by a plate 44; which cylinder 43 operates a piston presenting a rod 45 connected to brackets 42, to move frame 32 a given distance vertically upwards from the FIG. 5, 6 position.

Each tray 31 comprises an upper surface A and a lower surface B superimposed one over the other and separated by a distance equal to said vertical travel of frame 32. Surfaces A and B are each designed to receive a respective pack 14, and comprise respective thin metal plates 46, 47 fitted together in any known manner. Each plate 46, 47 presents an intermediate U-shaped recess forming a groove 52 for receiving and guiding locating pins 19 (FIG. 4) of packs 14.

Plate 47 of lower surface B is fitted to an underside support 61 presenting a front and rear transverse L section 63 and 64 by which it rests on sections 36 and 36' of frame 32. Rear section 64 presents slots engaged by pins 67 fitted to rear section 36; and front section 63 presents a tab 68 engaged by a snap-on lock mechanism 69 fitted to front section 36'.

The loading and unloading device also comprises means for transferring pack 14 between tray 31 and table 13, and which comprise a member 73 (FIGS. 1-3) movable between trays 31 and table 13 along axis Y, and an element 74 fitted to member 73, and which alternately engages opposite edges 14', 14" to push pack 14, and is retractable to permit idle travel of member 73, i.e. to permit member 73 to travel along pack 14 without pushing it.

More specifically, member 73 comprises a rectangular-section metal cross member 76 (FIGS. 5, 6) fitted by means of two angles 77 with two sides 78; each side 78 is fitted with a known externally prismatic ball guide 79 presenting a C-section inner guide portion 81 with the open part of the C facing downwards; and portion 81 of each guide 79 slides along a respective cylindrical bar 82 fitted by means of supporting blocks 83 to a bar 80 on block 12.

The lateral wall of each guide 79 facing inwards of the machine is fitted with an angle 84 to which is connected the movable element 86 of a linear actuator 87 also fitted to bar 80. Actuator 87 preferably comprises a known rodless pneumatic cylinder presenting solenoid valves for controlling partial or full travel of element 86 with no mechanical stops.

Actuators 87 provide for moving guides 79 between a rear position indicated by the continuous line in FIG. 5 and in which cross member 76 is located immediately in front of machining heads 22, and a forward position indicated by the dotted line in FIG. 5 and in which cross member 76 is positioned to the front of trays 31.

Cross member 76 presents a push element 74 for each tray 31, making a total of six elements 74, each of which comprises the bottom arm of a lever (FIG. 6) pivoting on a respective pin 90 fitted to cross member 76. The other arm 91 of each lever is inclined in relation to arm 74 and hinged to a common connecting rod 92 activated by a linear actuator comprising a pneumatic cylinder 93. More specifically, cylinder 93 is hinged to cross member 76, and connecting rod 92 presents an appendix 94 hinged to the piston rod 96 of cylinder 93.

In FIG. 6, arms 74 are positioned vertically to push packs 14. When pneumatic cylinder 93 is activated, rod 96 pushes connecting rod 92 leftwards to rotate arms 74 anticlockwise over packs 14, as shown by the dotted line for one of arms 74 in FIG. 6.

Finally, at the center line of each tray 31, table 13 (FIG. 2) presents a groove 97 aligned with grooves 52 in plates 46 and 47, and which houses locating pins 19 of pack 14. At each groove 97, table 13 presents a device 98 for positioning and aligning pack 14 for machining, and one of which is shown schematically by the dotted line in FIG. 2.

When pack 14 is placed on the corresponding portion of table 13, with the two pins 19 (FIG. 4) inside groove 97, respective device 98 is activated to first engage and align pins 19 along the center line of groove 97, and then engage the pin 19 adjacent to edge 14' to position it correctly along axis Y on a fixed locator on table 13, substantially as described in U.S. Pat. No. 5,354,153.

Figure 7:
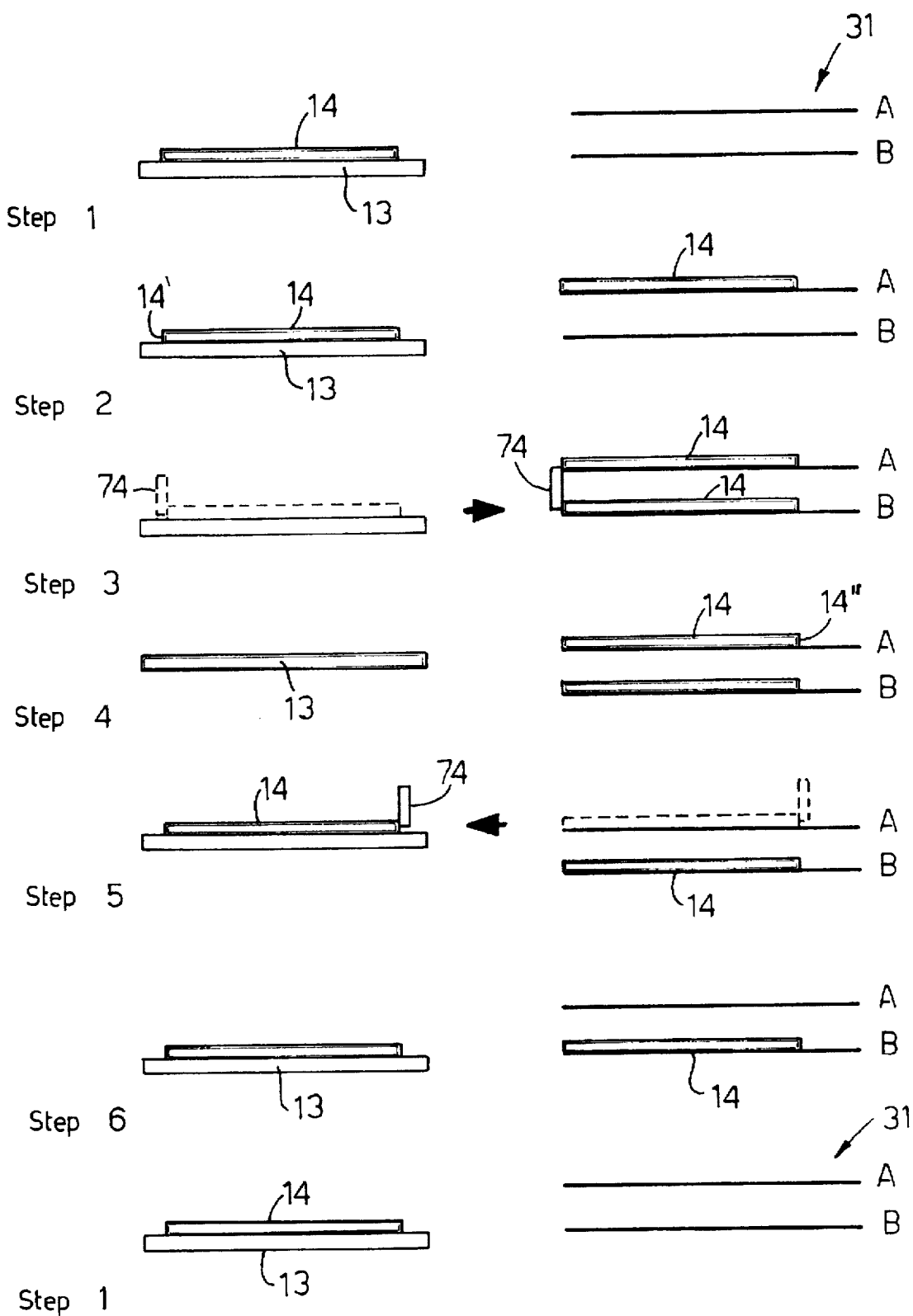
FIG. 7 shows the steps in the pack loading and unloading cycle.
Figure 8:
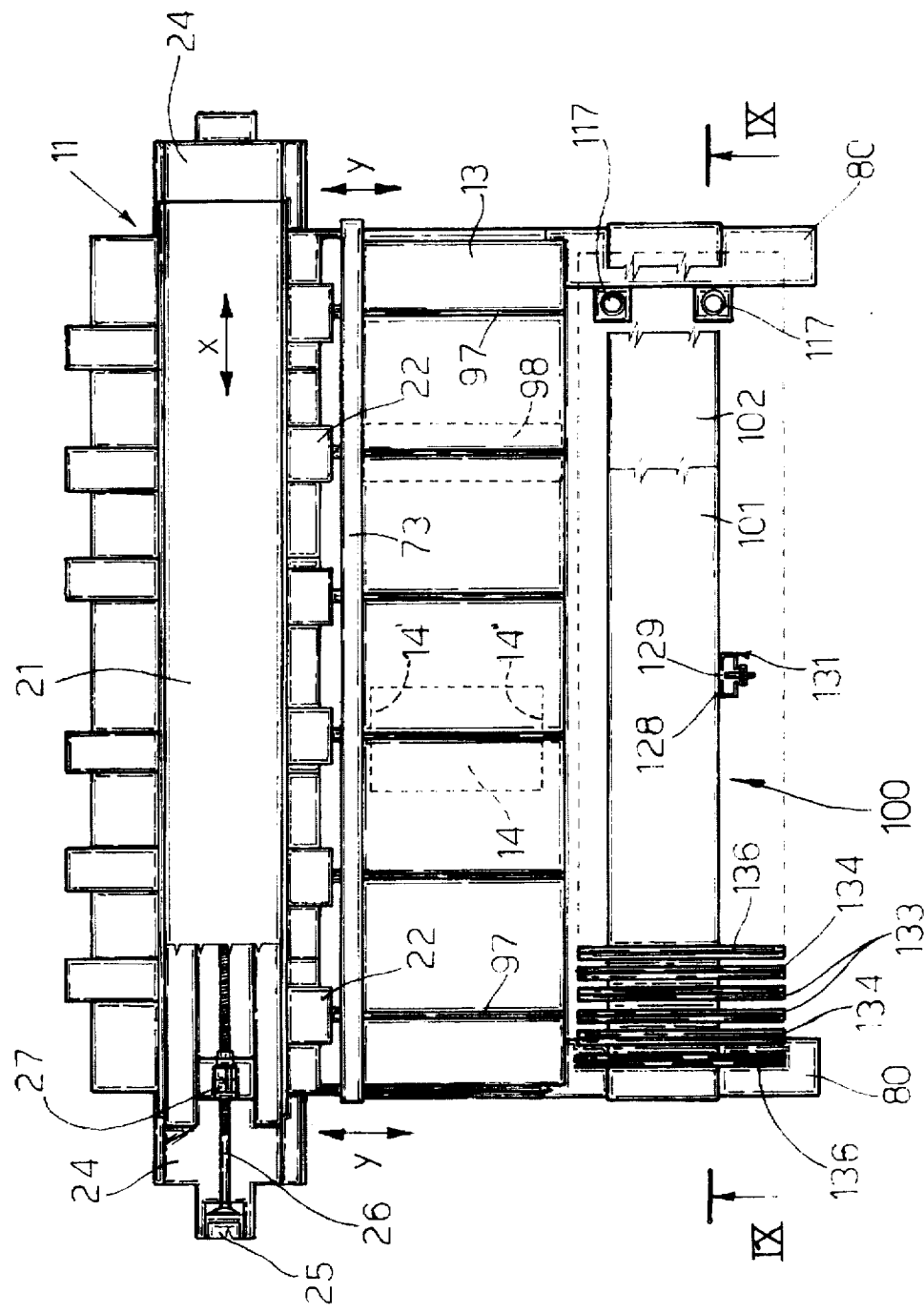
FIG. 8 shows a schematic plan view of a machine for drilling printed circuit boards, and incorporating a further embodiment of a loading and unloading device in accordance with the present invention.
Figure 9:
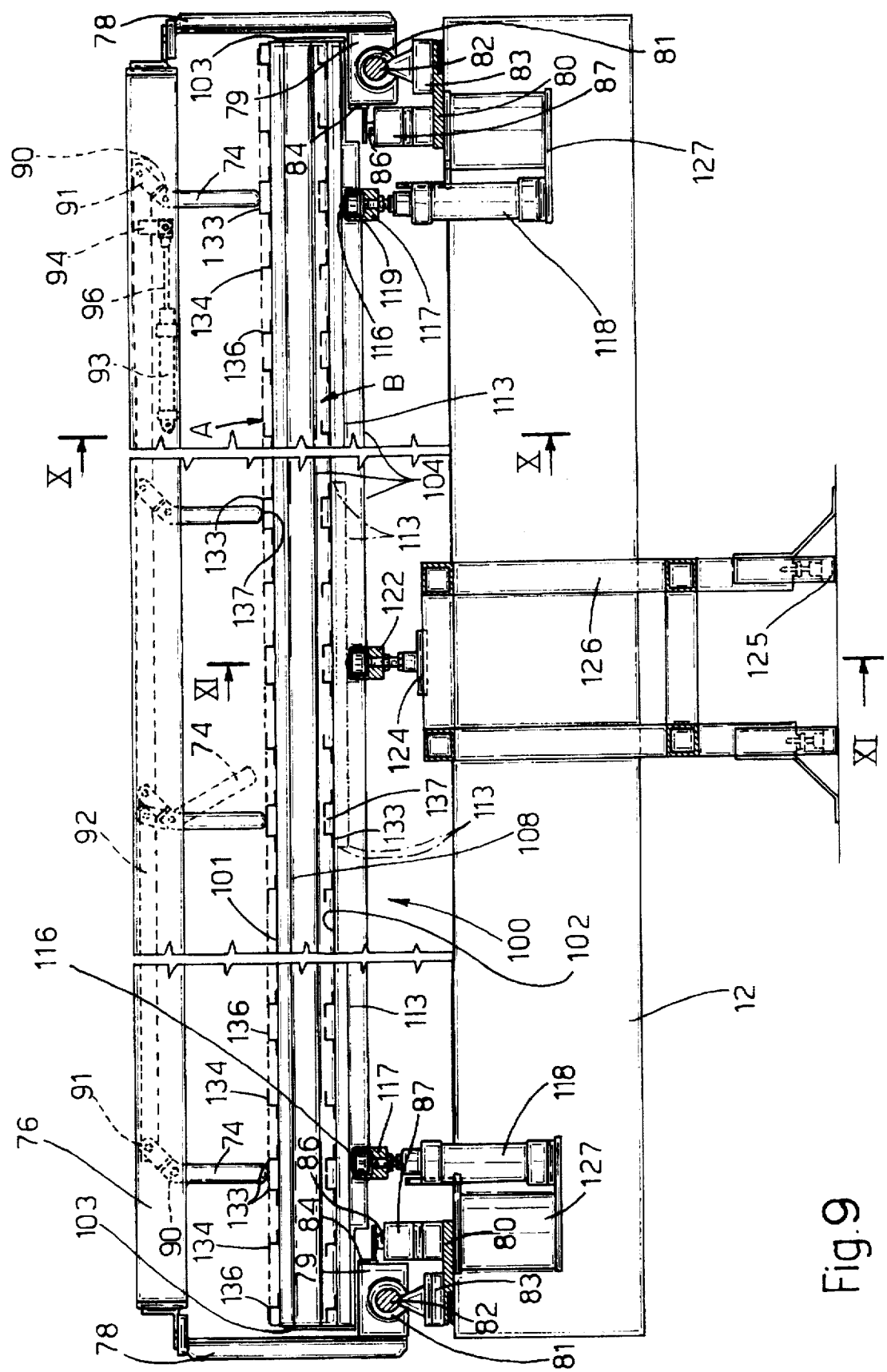
FIG. 9 shows a partial larger-scale section of the loading and unloading device along line IX—IX in FIG. 8.
Figure 10:
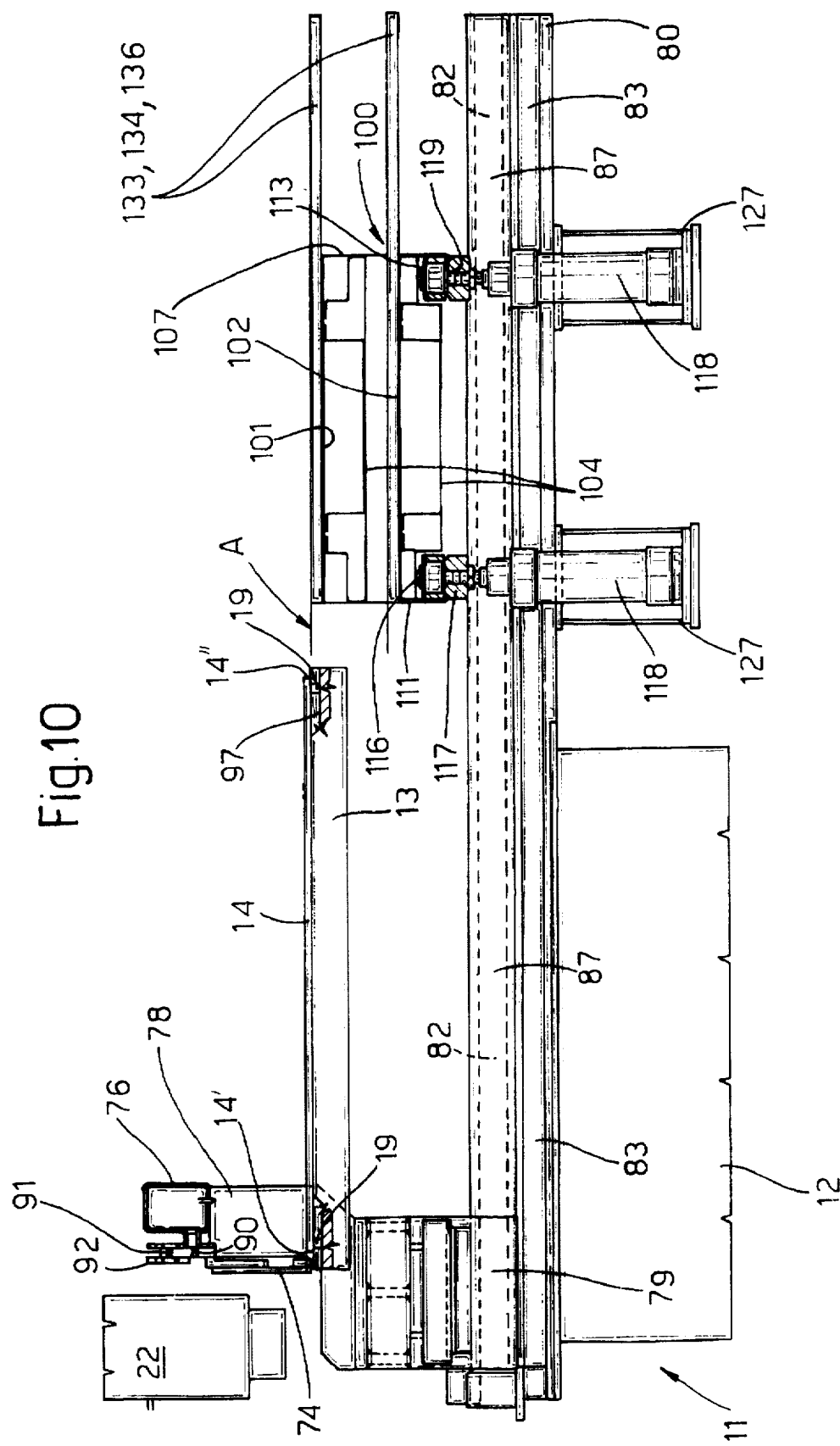
FIG. 10 shows a section along line X—X in FIG
Figure 11:
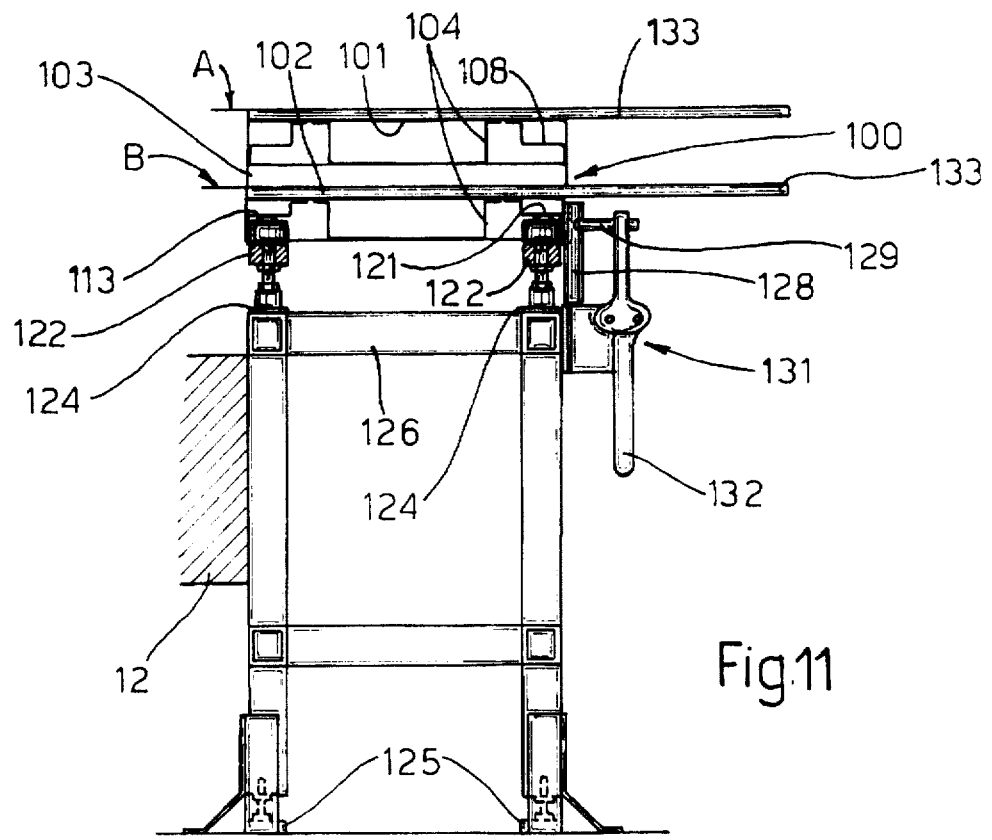
FIG. 11 shows a partial section along line XI—XI in FIG. 9.

The operating cycle of the loading and unloading device will now be described with reference to FIG. 7 showing the main steps in the cycle.

When a first number of packs 14 are placed on table 13 and are being drilled by machining heads 22, cross member 76 is set to the FIG. 5 position with arms 74 over packs 14; table 13 may travel along axis Y and crosspiece 21 along axis X to position heads 22 at any point in relation to respective packs 14; and frame 32 keeps trays 31 in the raised position with surfaces B flush with table 13, as shown in step 1 in FIG. 7.

While the first number of packs 14 are being machined, the operator places a pack 14 of a second number of packs on surface A of each tray 31, as shown in step 2 in FIG. 7; and upon completion of the first number of packs 14, table 13 is moved into the pack transfer position adjacent to trays 31, as shown in FIG. 2.

Piston 93 (FIG. 6) is then activated to move rod 96 and connecting rod 92 rightwards and rotate arms 74 clockwise into the FIG. 6 position engaging edge 14' of packs 14; and linear actuators 87 (FIG. 5) are then activated to move cross member 76 forwards so that arms 74 transfer the first number of packs 14 from table 13 on to surfaces B of trays 31, as shown in step 3 in FIG. 7.

Pneumatic cylinder 43 is then activated to lower frame 32 and position surfaces A of trays 31 flush with table 13, as shown in step 4 in FIG. 7; at the same time, cylinder 93 is activated to withdraw arms 74; and linear actuators 87 are activated to move cross member 76 idly along axis Y to the front of trays 31 and into the position shown by the dotted line in FIG. 5, so that arms 74 travel along the second number of packs 14 without affecting them.

Arms 74 are then lowered and linear actuators 87 activated in reverse; cross member 76 is moved back along axis Y; arms 74 engage edges 14' of the second number of packs 14 to transfer them on to table 13, as shown in step 5 in FIG. 7; arms 74 are then rotated into the raised position; and cross member 76 is again moved idly so that arms 74 travel along packs 14 without affecting them.

While the second number of packs 14 are being machined, frame 32 is raised by means of pneumatic cylinder 43 to position surfaces B of trays 31 flush with table 13, as shown in step 6 in FIG. 7; the operator removes the machined first number of packs 14 from surfaces B of trays 31; and the device returns to the start condition in step 1.

In the FIG. 8–12 embodiment, any parts similar to and operating in the same way as those in FIGS. 1–6 —particularly as regards the FIG. 7 cycle—are indicated using the same numbering system with no further description. In place of frame 32 in FIG. 5, drilling machine 11 (FIG. 8) presents a front frame 100 comprising two plates 101 and 102 connected to each other by two sides 103 (FIG. 9), and each welded to two bent tabs 106 (FIG. 12) of a reinforcing plate 104.

Plate 101 presents two vertical walls 107 fitted with two step-shaped metal plates 108 fitted to plate 101, symmetrical with each other, and which provide for reinforcing the two edges of plate 101. Lower plate 102 also presents two vertical walls 111 terminating at the bottom with respective bent edges 112, and fitted with two step-shaped metal plates 113 similar to plates 108.

Plates 113 form two lateral sliding surfaces of frame 100, for which purpose, each plate 113 rests on two ball bearings 116 (FIG. 9) on which it slides with a minimum of friction. Each ball 116 is fitted to a vertical-axis roller 117 in turn fitted adjustably to a linear actuator comprising a pneumatic cylinder 118. Roller 117 presents an annular groove 119 (FIG. 12) engaged by edge 112 of respective vertical wall 111, so that frame 100 is secured vertically to the four rollers 117.

Each plate 113 also rests on a third ball bearing 121 (FIG. 11) also fitted to a vertical-axis roller 122 presenting a groove 123. Each roller 122 is fitted adjustably to a plate 124 in turn fitted to a structure 126 fitted at the front to the center line of block 12 and resting on the floor on adjustable feet 125. Pneumatic cylinders 118 (FIGS. 9, 10) are fitted to respective supports 127, two of which are fitted at the bottom to the projecting portion of the right-hand bar 80, and the other two of which are fitted to the projecting portion of the left-hand bar 80.

The two front walls 107 and 111 of plates 101 and 102 are also connected by a pair of opposed vertical channel sections 128 (FIG. 11) placed at such a distance as to form a seat normally engaged by a pin 129 of a lock mechanism 131 comprising an operating lever 132 which is rotated manually to release pin 129 from its seat. For which purpose, lever 132 is connected to pin 129 by a known toggle mechanism which, in the lock position, is set beyond the dead center position to ensure pin 129 is locked.

Figure 12:
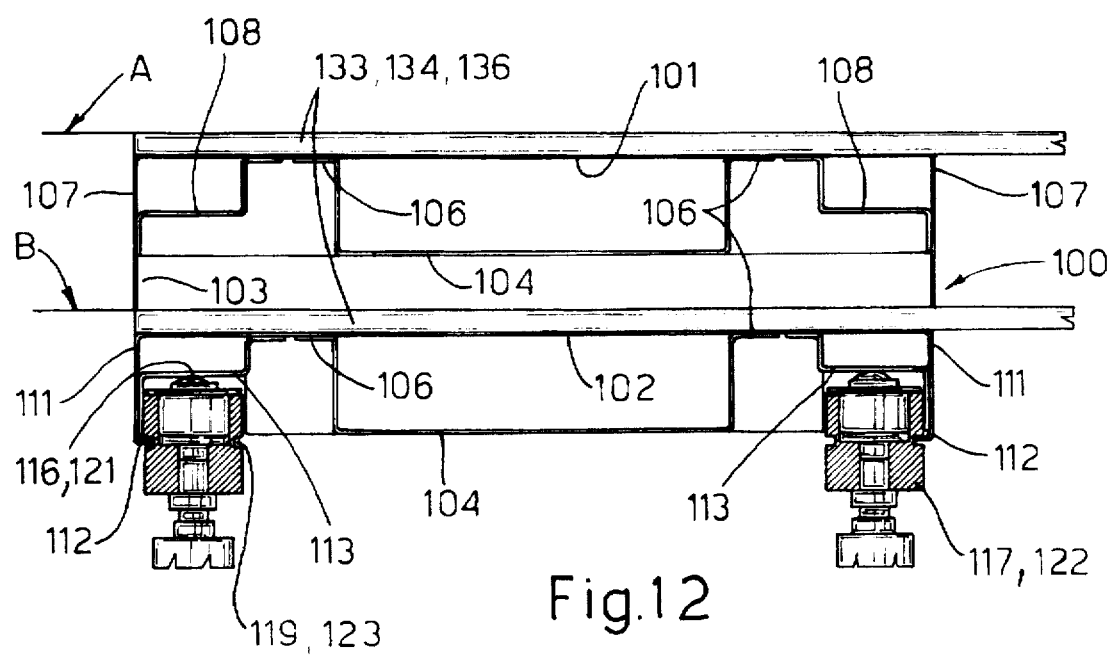
FIG. 12 shows a larger-scale detail of FIGS. 10 and 11.

For each machining head 22, plates 101 and 102 (FIG. 9) present supporting means comprising three pairs of slide bars 133, 134, 136 for pack 14. Bars 133, 134, 136 extend along axis Y to a length corresponding to the size of pack 14 and in general greater than the width of plate 101, 102 (FIG. 12). Each bar 133 presents a Z-shaped section with one wing fitted to plate 101, 102, and one wing supporting pack 14.

The bars in pairs 133, 134, 136 are symmetrical in relation to the vertical axis of respective arm 74. More specifically, bars 133 in the central pair are so spaced as to form an opening 137 for guiding pins 19 of packs 14. The other two pairs of bars 134, 136 provide solely for supporting pack 14. The top wings of bars 133, 134, 136 of plates 101 and 102 define superimposed surfaces A and B for receiving respective packs 14 for each machining head 22, so that packs 14 are in this case transferred between table 13 and bars 133, 134, 146 of plates 101 and 102.

To enable access for servicing table 13 or other parts of machine 11, lever 132 (FIG. 11) is turned anticlockwise to release pin 129 from its seat between sections 128 and so free frame 100; and frame 100 is then moved manually to the right or left, while remaining supported on the two central ball bearings 121 and the two ball bearings 116 on the side towards which it is moved. The dash and dot line in FIG. 9 indicates the two ends of plates 113 in the two limit positions of frame 100, for enabling successive access to the two halves of the machine.

The advantages of the loading and unloading device and method according to the present invention will be clear from the foregoing description. In particular, the device provides for parallel loading and unloading of packs 14 for all of machining heads 22, thus enabling front access by the operator; for manually unloading the machined packs 14 off supports 31 or 133–136, and loading a new set of packs 14 during machining by heads 22; and for using the same transfer elements for both loading and unloading by engaging opposite edges 14", 14" of packs 14. Moreover, the printed circuit supporting structure in the FIG. 8–12 embodiment is straightforward and cheap to produce, and provides for transversely moving frame 100 to both the right and left to simplify maintenance.

Clearly, changes may be made to the embodiments of the device and method as described and illustrated herein without, however, departing from the scope of the present invention. For example, the device may be applied to a machine featuring a different number of machining heads 22, or even only one head 22; the device may be located differently, e.g. to the side or rear of the machine; and changes may be made to the means for guiding and lifting frame 32 or 100, and/or to the means for displacing cross member 76.

What is claimed is:

1. A device for loading and unloading printed circuit boards on a machine tool, comprising:

a table for supporting at least one of at least one formed pack and a group of mutually connected circuit boards, said at least one formed pack having a rectangular shape and providing a pair of opposite edges;

at least one machining head;

a control system for controlling relative displacement of said at least one machining head and said table along two axes;

two superimposed parallel surfaces for respectively supporting a first pack unloaded from said table and a second pack loaded on said table, said two superimposed parallel surfaces being vertically movable to be positioned in correspondence with said table; and a transfer system transferring said at least one formed pack between said table and said two superimposed parallel surfaces, said transfer system including a member and an element, said member being movable over said two superimposed parallel surfaces and over said table, said element being fitted to said member and being adapted to alternately engage said opposite edges of each said at least one formed pack, said member causing said element to selectively load said at least one formed pack on said table and unload said at least one formed pack off said table by pushing said at least one formed pack, said element being selectively retractable for allowing said member to extend along said at least one formed pack without said element engaging said opposite edges.

2. The device as claimed in claim 1, further comprising:
a straight guide member for slidably guiding said member; and
a linear actuating member moving said member along one of said two axes to deliver said element to a first position, said element being delivered to said first position for engaging with a first one of said opposite edges of said first pack, said first one of said opposite edges being engaged for unloading said first pack off said table, said linear actuating member delivering said element to a second position for engaging a second one of said opposite edges of said second pack, said second one of said opposite edges being engaged for loading said second pack on said table.

3. The device as claimed in claim 1, wherein said table is movable in relation to a fixed base along a first axis of said two axes, and said machining head being movable along the other axis of said pair of axes, wherein said pack is transferred along said first axis, said table being set to a loading position during operation of said member.

4. The device as claimed in claim 3, wherein said first axis extends between the front and rear of said machine tool, and wherein said surfaces are located at the front of said machine tool.

5. The device as claimed in claim 3, wherein said surfaces include a pair of parallel plates, each presenting an intermediate guide for receiving a pair of locating pins provided on said pack.

6. The device as claimed in claim 5, wherein said table provides a groove located in correspondence with said intermediate guide, said table further providing a mechanism for aligning the pack when the pack is transferred on to the table, said aligning mechanism engaging said pins when said pins are inserted inside said groove.

7. The device as claimed in claim 4, wherein said surfaces are formed using an associated integral structure, and wherein said machine tool includes a plurality of machining heads, the plurality of machining heads being integrally movable along said other axis, a predetermined amount of said structures being associated with said machining heads for simultaneously loading on said table and unloading off said table an associated amount of said at least one pack, said member including a cross member sliding along two straight guides and providing a defined amount of retractable elements associated with said machining heads.

8. The device as claimed in claim 7, wherein each said retractable element includes an arm pivoting on said cross member and connected to a common connecting rod operated by a linear actuator.

9. The device as claimed in claim 7, wherein said member includes two ball sleeves guided on two cylindrical lateral bars, said member being moved along said cylindrical bars by two pneumatic linear actuators.

10. The device as claimed in claim 7, wherein said structures are fitted to a common frame being moved vertically by pneumatic means to position said structures with said surfaces alternately flush with said table.

11. The device as claimed in claim 10, wherein said structures are carried by two parallel plates, said two parallel plates connected via two sides to form said common frame, said pneumatic means including at least two pneumatic cylinders integral with said straight guides.

12. The device as claimed in claim 11, wherein said frame is movable laterally to permit access to said machine, and further comprising:
a hand-operated apparatus for locking said frame in a work position.

13. The device as claimed in claim 12, wherein said frame is movable laterally in both directions.

14. The device as claimed in claim 12, wherein said frame slides laterally on rolling elements integral with said straight guides, each said rolling element including a ball bearing fitted to a guide roller.

15. The device as claimed in claim 14, wherein at least a first plate of said two plates includes two sliding surfaces resting on two pairs of said ball bearings, each of said guide rollers being fitted to one of said at least two pneumatic cylinders.

16. The device as claimed in claim 15, wherein said guide rollers engage a respective wall of said first plate (102) in pairs, and wherein each of said rollers provides an annular groove engaged by a bent edge of said wall.

17. The device as claimed in claim 16, wherein said sliding surfaces rest on two further ball bearings fitted to respective guide rollers, the respective guide rollers fitted to a fixed structure.

18. The device as claimed in claim 7, wherein, for each machining head, each said structure includes a number of pairs of Z-shaped bars for supporting said packs, one of said bars in one of said pairs positioned adjacent so as to define an opening forming said intermediate guide.

19. The device as claimed in claim 11, wherein each one of said structures is formed from a tray having a pair of thin metal plates, each one of said metal plates being provided with an intermediate guide comprising a U-shaped groove for receiving a pair of locating pins, said locating pins provided on each said pack.

20. The device as claimed in claim 19, wherein each said tray includes a base element removably seatable with said frame, said base element providing an edge engaged in snap-on manner by a mechanism fitted to said frame and operated manually.

21. A method of loading and unloading printed circuit boards on a machine tool, at least one pack of said printed circuit boards being unloaded off a table and loaded on said table, said table being movable along an first axis, said pack being rectangular and having a pair of opposite edges, the method comprising the steps of:
positioning a first surface flush with said table when a first pack of said at least one pack is machined;
positioning a second pack of said at least one pack on a second surface;
after said first pack is machined, unloading said first pack off said table unto said first surface solely by pushing one of said pair of opposite edges;
moving said first and second surfaces for positioning said second surface flush with said table;
loading said second pack from said second surface on said table solely by pushing another one of said pair opposite edges; and
removing said first pack from said first surface.

22. The method as claimed in claim 21, wherein said table is set to a predetermined position during said steps of transferring said first and said second packs.

23. The method as claimed in claim 21, wherein said push is imparted by a single element, and further comprising the step of:

withdrawing said element;

moving said element idly along the pack;

withdrawing said element; and moving said element idly along the pack being performed alternately after each said push.

* * * * *

UNITED STATES PATENT AND TRADEMARK OFFICE
CERTIFICATE OF CORRECTION

PATENT No. : 5,711,641

DATED : January 27, 1998

INVENTOR(S): Luigi Piovano

It is certified that error appears in the above-identified patent and that said Letters Patent is hereby corrected as shown below:

On the cover page, [75] the inventor's address should read --S. Giusto Canavese--; and On the cover page [30], the second priority date should read --November 25, 1994--.

Signed and Sealed this

Fifth Day of May, 1998

*Attest:*

*Attesting Officer*

BRUCE LEHMAN

*Commissioner of Patents and Trademarks*